(12) United States Patent
Uchida

(10) Patent No.: US 9,613,990 B2
(45) Date of Patent: Apr. 4, 2017

(54) SEMICONDUCTOR DEVICE AND METHOD FOR MANUFACTURING SAME

(71) Applicant: Sharp Kabushiki Kaisha, Osaka-shi, Osaka (JP)

(72) Inventor: Seiichi Uchida, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/102,884

(22) PCT Filed: Aug. 28, 2014

(86) PCT No.: PCT/JP2014/072615
§ 371 (c)(1),
(2) Date: Jun. 9, 2016

(87) PCT Pub. No.: WO2015/087586
PCT Pub. Date: Jun. 18, 2015

(65) Prior Publication Data
US 2016/0380006 A1 Dec. 29, 2016

(30) Foreign Application Priority Data
Dec. 10, 2013 (JP) ................................. 2013-254917

(51) Int. Cl.
*H01L 27/32* (2006.01)
*H01L 27/12* (2006.01)
(Continued)

(52) U.S. Cl.
CPC .... *H01L 27/1255* (2013.01); *G02F 1/136213* (2013.01); *H01L 27/124* (2013.01);
(Continued)

(58) Field of Classification Search
CPC ............. H01L 27/1255; H01L 27/3248; H01L 27/1248; H01L 27/127; H01L 27/3265;
(Continued)

(56) References Cited

U.S. PATENT DOCUMENTS 9,209,203 B2 * 12/2015 Inoue .................. H01L 27/1225
2003/0047785 A1 3/2003 Kawasaki et al.
(Continued)

FOREIGN PATENT DOCUMENTS

JP 2003-086808 A 3/2003
JP 2008-040343 A 2/2008
(Continued)

OTHER PUBLICATIONS

Official Communication issued in International Patent Application No. PCT/JP2014/072615, mailed on Nov. 25, 2014.

*Primary Examiner* — David Vu
(74) *Attorney, Agent, or Firm* — Keating & Bennett, LLP

(57) ABSTRACT

A semiconductor device (101) includes a plurality of pixel regions Pix arranged in a matrix having a row direction and a column direction, wherein each of the plurality of pixel regions Pix includes a thin film transistor (10) which includes a gate electrode (2), a gate insulating layer (5) covering the gate electrode, an oxide semiconductor layer (7A) provided on the gate insulating layer, and a source electrode (9s) and a drain electrode (9d) which are electrically connected to the oxide semiconductor layer, a metal oxide layer (7B) formed out of a same oxide film as the oxide semiconductor layer, an interlayer insulating layer (13) covering the thin film transistor and the metal oxide layer, and a pixel electrode (15) provided on the interlayer insulating layer and electrically connected to the drain electrode, the metal oxide layer (7B) includes a conductor region (70c), and the pixel electrode (15) overlaps with at least a part of the conductor region (70c) with the interlayer insulating layer (13) interposed therebetween.

16 Claims, 9 Drawing Sheets

(51) Int. Cl.
  *G02F 1/1362* (2006.01)
  *G02F 1/1368* (2006.01)
  *H01L 29/786* (2006.01)

(52) U.S. Cl.
  CPC ........ *H01L 27/127* (2013.01); *H01L 27/1225* (2013.01); *H01L 27/1248* (2013.01); *H01L 27/3248* (2013.01); *H01L 27/3265* (2013.01); *G02F 1/1368* (2013.01); *G02F 2201/40* (2013.01); *H01L 29/7869* (2013.01)

(58) Field of Classification Search
  CPC ............... H01L 27/124; H01L 27/1225; H01L 29/7869; G02F 1/136213
  See application file for complete search history.

(56) References Cited

U.S. PATENT DOCUMENTS

| | | |
|---|---|---|
| 2008/0035920 A1 | 2/2008 | Takechi et al. |
| 2012/0138922 A1 | 6/2012 | Yamazaki et al. |

FOREIGN PATENT DOCUMENTS

| | | |
|---|---|---|
| JP | 2011-091110 A | 5/2011 |
| JP | 2012-134475 A | 7/2012 |

\* cited by examiner (a)

(b)

(a)

(b)

SEMICONDUCTOR DEVICE AND METHOD FOR MANUFACTURING SAME

TECHNICAL FIELD

The present invention relates to a semiconductor device in which an oxide semiconductor is used and a manufacturing method thereof.

BACKGROUND ART

An active matrix substrate for use in liquid crystal display devices, or the like, includes a switching element, such as a thin film transistor (hereinafter, "TFT"), in each pixel. Examples of such a switching element which have been conventionally used in various applications include a TFT which includes an amorphous silicon film as the active layer (hereinafter, "amorphous silicon TFT") and a TFT which includes a polycrystalline silicon film as the active layer (hereinafter, "polycrystalline silicon TFT").

In recent years, using an oxide semiconductor as the material of the active layer of a TFT, instead of amorphous silicon or polycrystalline silicon, has been proposed. Such a TFT is referred to as "oxide semiconductor TFT". The oxide semiconductor has a higher mobility than the amorphous silicon. Therefore, the oxide semiconductor TFT is capable of operating at a higher speed than the amorphous silicon TFT. The oxide semiconductor film is manufactured through a simpler process than the polycrystalline silicon film and is therefore applicable to devices which require a large area. An active matrix substrate which includes an oxide semiconductor TFT (hereinafter, "TFT substrate") is disclosed in, for example, Patent Document 1.

For example, Patent Document 2 discloses integrally forming a semiconductor layer which serves as the active layer of a TFT and an electrically-conductive layer, such as a pixel electrode, by reducing the resistance in part of the oxide semiconductor film. Patent Document 2 discloses that the above-described resistance reducing process enables to manufacture a TFT substrate which includes an oxide semiconductor TFT at a lower cost.

In the case where a conventional TFT substrate disclosed in, for example, Patent Document 1 or 2 is used in a liquid crystal display device, storage capacitance is provided in the TFT substrate when necessary. The storage capacitance is formed by a storage capacitance electrode (or storage capacitance wire), a pixel electrode, and a dielectric layer interposed therebetween. The storage capacitance electrode is formed by, for example, an electrically-conductive film which is the same as a gate wire.

CITATION LIST

Patent Literature

Patent Document 1: Japanese Laid-Open Patent Publication No. 2003-86808
Patent Document 2: Japanese Laid-Open Patent Publication No. 2008-40343

SUMMARY OF INVENTION

Technical Problem

Now, consider a case where storage capacitance is provided in a TFT substrate. If a storage capacitance electrode is formed by an electrically-conductive film (typically, metal film) which is the same as a gate wire as described above, the storage capacitance can be formed in each pixel without complicating the manufacturing process. However, disadvantageously, the aperture ratio and the light transmittance decrease by the amount of the storage capacitance electrode.

According to research conducted by the present inventor, it was found that in the TFT substrate disclosed in Patent Document 2, for example, the proportion of the area of the pixel electrode to the entire pixel area is small, and therefore, there is a probability that the aperture ratio further decreases. Details will be described later.

The present invention was conceived in view of the above-described circumstances. One of the objects of one embodiment of the present invention is to provide a semiconductor device which can be manufactured through a simple process and which can realize high aperture ratio and high transmittance as compared with conventional semiconductor devices, and a manufacturing method thereof.

Solution to Problem

A semiconductor device of one embodiment of the present invention includes a substrate and a plurality of pixel regions arranged on the substrate in a matrix having a row direction and a column direction, wherein the plurality of pixel regions each include a thin film transistor supported on the substrate, the thin film transistor including a gate electrode, a gate insulating layer covering the gate electrode, an oxide semiconductor layer provided on the gate insulating layer, and a source electrode and a drain electrode which are electrically connected to the oxide semiconductor layer, a metal oxide layer formed by the same oxide film as the oxide semiconductor layer, an interlayer insulating layer covering the thin film transistor and the metal oxide layer, and a pixel electrode provided on the interlayer insulating layer and electrically connected to the drain electrode, the metal oxide layer includes a conductor region, and the pixel electrode overlaps with at least a part of the conductor region with the interlayer insulating layer interposed therebetween.

In one embodiment, the semiconductor device further includes a plurality of gate lines each extending generally parallel in the row direction, and a plurality of source lines each extending generally parallel in the column direction, wherein the plurality of pixel regions include a first pixel region and a second pixel region adjoining the first pixel region in the column direction, and the conductor regions of the metal oxide layers which are present in the first pixel region and the second pixel region are electrically connected to each other.

In one embodiment, the metal oxide layer in the first pixel region and the metal oxide layer in the second pixel region are integrally formed.

In one embodiment, the semiconductor device further includes a connecting wire formed by the same electrically-conductive film as the plurality of source lines and extending in the column direction across the first and second pixel regions, wherein the conductor regions of the metal oxide layers which are present in the first pixel region and the second pixel region are electrically connected to each other via the connecting wire.

In one embodiment, the semiconductor device further includes first and second connecting portions formed by the same electrically-conductive film as the plurality of source lines and separated from each other, wherein the conductor region of the metal oxide layer which is present in the second pixel region is electrically connected to the conductor region of the metal oxide layer which is present in the first pixel region via the first connecting portion and is electrically connected to the conductor region of the metal oxide layer which is present in another pixel region adjoining the second pixel region in the column direction via the second connecting portion.

In one embodiment, the plurality of pixel regions each further includes a contact portion at which the drain electrode and the pixel electrode are in direct contact with each other in a contact hole formed in the interlayer insulating layer, and when viewed in a direction normal to the substrate, the contact portion is arranged so as to adjoin the thin film transistor in the column direction.

In one embodiment, the plurality of gate lines includes a first gate line electrically connected to the gate electrode which is present in the first pixel region, when viewed in a direction normal to the substrate, the first gate line includes a first portion and a second portion whose width is smaller than that of the first portion, and when viewed in a direction normal to the substrate, at least a part of the oxide semiconductor layer that is present in the first pixel region is arranged so as to overlap with the first portion, and the connecting wire or the first connecting portion extends so as to overpass the second portion.

In one embodiment, the metal oxide layer further includes a semiconductor region, and the semiconductor region is present in a perimetric portion of the metal oxide layer.

In one embodiment, the interlayer insulating layer includes a first insulating film and a second insulating film provided on the first insulating film, the first insulating film has an opening over the metal oxide layer, and the conductor region includes part of the metal oxide layer which is exposed through the opening, and the semiconductor region includes part of the metal oxide layer which is covered with the first insulating film.

In one embodiment, part of the interlayer insulating layer which is present between the conductor region of the metal oxide layer and the pixel electrode includes the second insulating film and does not include the first insulating film.

In one embodiment, the oxide semiconductor layer and the metal oxide layer include at least one metal element among In, Ga and Zn.

In one embodiment, the oxide semiconductor layer and the metal oxide layer include a crystalline portion.

A semiconductor device manufacturing method of one embodiment of the present invention is a method for manufacturing a semiconductor device, the semiconductor device including a substrate, a plurality of pixel regions arranged in a matrix having a row direction and a column direction, a thin film transistor provided in each of the plurality of pixel regions, a plurality of gate lines each extending generally parallel in the row direction, and a plurality of source lines each extending generally parallel in the column direction, the plurality of pixel regions including first and second pixel regions adjoining each other in the column direction, the method including in each of the first and second pixel regions: (a) forming on the substrate a gate electrode and a gate insulating layer covering the gate electrode; (b) forming an oxide semiconductor film on the gate insulating layer and patterning the formed oxide semiconductor film, thereby forming an oxide semiconductor layer and a metal oxide layer, the oxide semiconductor layer being arranged such that at least a part of the oxide semiconductor layer overlaps with the gate electrode with the gate insulating layer interposed therebetween; (c) forming a source electrode and a drain electrode so as to be in contact with the oxide semiconductor layer; (d) forming a first insulating film so as to cover the source electrode and the drain electrode and the metal oxide layer and forming in the first insulating film a first opening through which part of the drain electrode is exposed and a second opening through which part of the metal oxide layer is exposed; (e) converting part of the metal oxide layer which is exposed through the second opening into a conductor, thereby forming a conductor region, while part of the metal oxide layer which is not converted into a conductor remains as a semiconductor region; (f) forming a second insulating film on the first insulating film and in the first and second openings and removing part of the second insulating film which is present in the first opening, thereby forming a contact hole which penetrates through the first and second insulating films and through which the drain electrode is exposed; and (g) forming a pixel electrode on the second insulating film and in the contact hole, the pixel electrode being arranged so as to be in contact with the drain electrode in the contact hole and to overlap with at least a part of the conductor region of the metal oxide layer with the second insulating film interposed therebetween.

In one embodiment, step (b) includes integrally forming the metal oxide layers which are present in the first and second pixel regions.

In one embodiment, the method further includes the step of forming a connecting wire for electrically connecting the metal oxide layers which are present in the first and second pixel regions with each other, the connecting wire being formed by the same electrically-conductive film as the source and drain electrodes.

In one embodiment, the method further includes the step of forming first and second connecting portions so as to be separated from each other, the first connecting portion being arranged so as to connect the metal oxide layers which are present in the first and second pixel regions, and the second connecting portion being arranged so as to connect the metal oxide layers which are present in the second pixel region and another pixel region adjoining the second pixel region in the column direction.

Advantageous Effects of Invention

According to an embodiment of the present invention, a semiconductor device including an oxide semiconductor TFT which can be manufactured through a simple process and which can realize high aperture ratio and high transmittance can be provided.

DESCRIPTION OF EMBODIMENTS

First Embodiment

Hereinafter, the first embodiment of the present invention is described with reference to the drawings.

Figure 1:
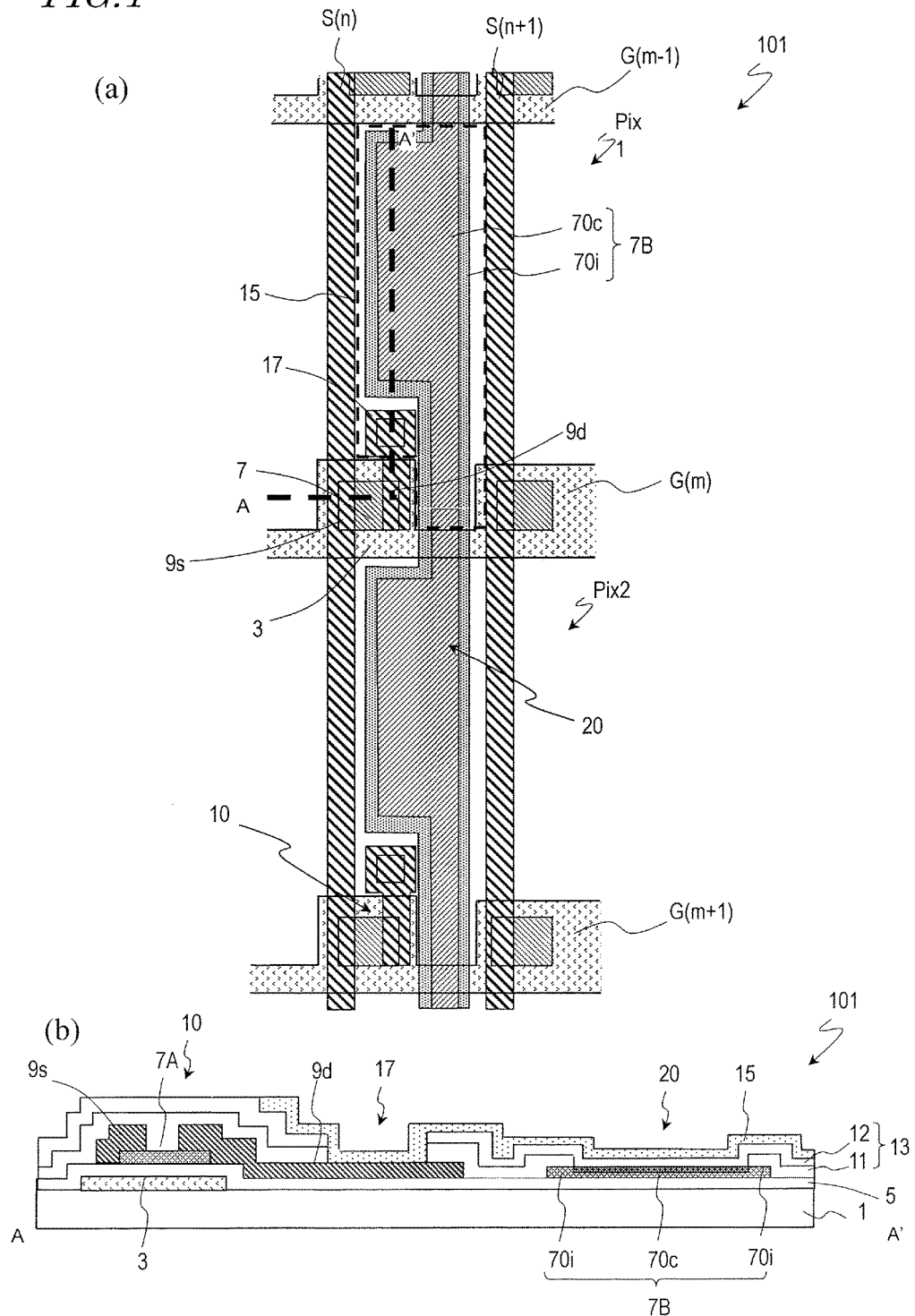
FIGS. 1 (a) and (b) are respectively a plan view and cross-sectional view of a semiconductor device 101 of the first embodiment of the present invention.

FIG. 1(a) is a plan view of a semiconductor device (TFT substrate) 101 of the present embodiment. FIG. 1(b) is a cross-sectional view taken along line A-A' of FIG. 1(a), showing a TFT 10 and a storage capacitance 20 in the semiconductor device 101. Note that, in the present embodiment, the "semiconductor device" only needs to be a device which includes a TFT and a capacitive element, and includes a wide variety of TFT substrates and display devices including a TFT substrate.

The TFT substrate 101 is used in a liquid crystal display device which operates in, for example, a VA (Vertical Alignment) mode. The liquid crystal display device includes a plurality of pixels arranged in a matrix which has a row direction and a column direction. The TFT substrate 101 has a plurality of regions corresponding to the plurality of pixels of the display device (hereinafter, "pixel regions Pix"). Of the plurality of pixel regions Pix, two pixel regions Pix1, Pix2 adjoining each other in the column direction are shown in FIG. 1(a).

The TFT substrate 101 includes a substrate 1, a plurality of source lines (or source but lines) S extending generally parallel in the column direction, and a plurality of gate lines (or gate but lines) G extending generally parallel in the row direction. The row direction and the column direction may be perpendicular to each other. The row direction and the column direction may be a horizontal direction and a vertical direction, respectively, in the display plane of the liquid crystal display device. When viewed in a direction normal to the substrate 1, regions enclosed by the source lines S and the gate lines G are "pixel regions Pix". In each of the pixel regions Pix, a TFT 10, a metal oxide layer 7B, and a pixel electrode 15 are provided.

FIG. 1(a) shows adjoining two of the plurality of source lines S, source lines S(n), S(n+1), and three adjoining gate lines G(m−1), G(m), G(m+1) (n and m are natural numbers). A region enclosed by the source lines S(n), S(n+1) and the gate lines G(m−1), G(m) is referred to as "first pixel region Pix1". A region enclosed by the source lines S(n), S(n+1) and the gate lines G(m), G(m+1) is referred to as "second pixel region Pix2".

The gate electrode 3 of a TFT 10 provided in the first pixel region Pix1 is electrically connected to the gate line G(m), and the source electrode 9s of the TFT 10 is electrically connected to the source line S(n). Likewise, the gate electrode 3 of a TFT 10 provided in the second pixel region Pix2 is electrically connected to the gate line G(m+1), and the source electrode 9s of the TFT 10 is electrically connected to the source line S(n).

In each of the pixel regions Pix, the TFT 10 is supported by the substrate 1. The TFT 10 is a bottom gate TFT which includes a gate electrode 3, a gate insulating layer 5 covering the gate electrode 3, and an oxide semiconductor layer 7A, a source electrode 9s and a drain electrode 9d which are provided on the gate insulating layer 5. The oxide semiconductor layer 7A is arranged such that at least the channel region overlaps with the gate electrode 3 with the gate insulating layer 5 interposed therebetween. In the present embodiment, part of the gate line G extending over the oxide semiconductor layer 7A with the gate insulating layer 5 interposed therebetween forms the gate electrode 3. The source and drain electrodes 9s, 9d are electrically connected to opposite sides of the channel region of the oxide semiconductor layer 7A. The source and drain electrodes 9s, 9d each may be in direct contact with the oxide semiconductor layer 7A. In the present embodiment, part of the source line S which is in contact with the oxide semiconductor layer 7A forms the source electrode 9s. The source electrode 9s is electrically connected to the source line S. The drain electrode 9d is electrically connected to the pixel electrode 15. The TFT 10 is covered with an interlayer insulating layer 13.

The metal oxide layer 7B is formed by the same oxide film as the oxide semiconductor layer 7A. The metal oxide layer 7B includes a conductor region 70c. The conductor region 70c refers to a region whose resistance is lower than that of the oxide semiconductor layer 7A of the TFT 10 and is formed by, for example, performing a resistance-reduction treatment on an oxide semiconductor film. Here, the conductor region 70c is provided near the surface of the oxide semiconductor layer 7A. Note that the conductor region 70c may be provided along the thickness direction of the oxide semiconductor layer 7A. As shown in the drawings, the metal oxide layer 7B may include a semiconductor region 70i in addition to the conductor region 70c. The semiconductor region 70i may be present in a perimetric portion of the metal oxide layer 7B when viewed in a direction normal to the substrate 1.

The pixel electrode 15 is made of a transparent electrically-conductive material (e.g., ITO). The pixel electrode 15 is provided on the interlayer insulating layer 13 and is electrically connected to the drain electrode 9d of the TFT 10 in a contact hole formed in the interlayer insulating layer 13. This connection portion is referred to as "contact portion" 17.

The pixel electrode 15 is arranged so as to overlap with at least a part of the conductor region 70c of the metal oxide layer 7B with the interlayer insulating layer 13 interposed therebetween. Accordingly, the storage capacitance 20 is formed such that the conductor region 70c serves as a lower layer electrode (also referred to as "storage capacitance wire" or "storage capacitance electrode"), the pixel electrode 15 serves as an upper layer electrode, and part of the interlayer insulating layer 13 which is present between these electrodes serves as a dielectric layer. The upper layer electrode (pixel electrode 15) and the lower layer electrode (conductor region 70c) of the storage capacitance 20 are each made of a transparent electrically-conductive material. For example, in a liquid crystal display device, the storage capacitance 20 is electrically connected in parallel with the liquid crystal capacitance.

Since, according to the present embodiment, the lower layer electrode of the storage capacitance 20 is formed using the same oxide film as the oxide semiconductor layer 7A as described above, the storage capacitance 20 can be formed in the pixel region Pix without complicating the process. The storage capacitance 20 is made of a transparent material. Therefore, the storage capacitance 20 which has a desired area (the area viewed in a direction normal to the substrate 1) can be provided without decreasing the aperture ratio, and a sufficient storage capacitance value can be secured.

The conductor regions 70c of the metal oxide layers 7B which are present in the two pixel regions Pix1, Pix2 adjoining each other in the column direction may be electrically connected to each other. Although not shown, the conductor regions 70c which are present in all of the pixel regions Pix arranged in the column direction may be electrically connected to one another. This enables to supply a common storage capacitance voltage (Cs voltage) to the conductor regions 70c of the plurality of pixel regions Pix (which function as storage capacitance electrodes).

In the present embodiment, the metal oxide layers 7B which are present in the adjoining first and second pixel regions Pix1, Pix2 are integrally formed, and the conductor regions 70c of the metal oxide layers 7B are continuous. In other words, when viewed in a direction normal to the substrate 1, the metal oxide layers 7B of the pixel regions Pix1, Pix2 form a metal oxide wire extending from the first pixel region Pix1 to the second pixel region Pix2 so as to overpass the gate line G (here, gate line G(m)).

The metal oxide layers 7B which are present in three or more pixel regions Pix arranged in each column, preferably in all of the pixel regions Pix arranged in each column, may be integrally formed. For example, the metal oxide layers 7B of the plurality of pixel regions Pix arranged in the column direction may integrally form a metal oxide wire extending in the column direction so as to overpass a plurality of gate lines G.

In the present embodiment, in each of the pixel regions Pix, a TFT 10 is positioned near the intersection of the source line S and the gate line G. The contact portion that is for electrical connection between the pixel electrode 15 and the drain electrode 9d of the TFT 10 is positioned so as to adjoin the TFT 10 in the column direction. In the example illustrated in the drawing, when viewed in a direction normal to the substrate 1, the TFT 10 in the first pixel electrode Pix1 is present near the intersection of the source line S(n) and the gate line G(m), and the contact portion 17 is positioned in a region surrounded by the source line S(n), the gate line G(m) and the metal oxide layer 7B. Such a configuration enables the metal oxide layers 7B which are present in two pixel regions Pix adjoining each other in the column direction to be connected to each other, without decreasing the aperture ratio.

The interlayer insulating layer 13 that covers the TFT 10 also functions as a dielectric layer of the storage capacitance 20. In the present embodiment, the interlayer insulating layer 13 includes a first insulating film 11 and a second insulating film 12 provided on the first insulating film 11. The first insulating film 11 has an opening over the metal oxide layer 7B. The conductor region 70c of the metal oxide layer 7B includes part of the metal oxide layer 7B which is exposed through the opening of the first insulating film 11. On the other hand, the semiconductor region 70i includes another part of the metal oxide layer 7B which is covered with the first insulating film 11. In the opening of the first insulating film 11, the second insulating film 12 is provided so as to be in contact with the conductor region 70c. Part of the interlayer insulating layer 13 which is present between the lower layer electrode (conductor region 70c) and the upper layer electrode (pixel electrode 15) of the storage capacitance 20 includes the second insulating film 12 and does not include the first insulating film 11. That is, part of the interlayer insulating layer 13 which functions as the dielectric layer of the storage capacitance 20 is mainly formed by the second insulating film 12.

The above-described configuration can be realized by performing a resistance-reduction treatment (e.g., a plasma treatment which will be described later) on the metal oxide layer 7B using the first insulating film 11 as a mask. Note that, however, under some conditions of the resistance-reduction treatment, there is a probability that, when viewed in a direction normal to the substrate 1, the conductor region 70c is one size larger than the opening of the first insulating film 11 so as to overlap with the perimetric portion of the first insulating film 11.

Note that the interlayer insulating layer 13 is not limited to a two-layer structure such as described above but may have a multilayer structure consisting of three or more layers. Alternatively, the interlayer insulating layer 13 may be realized by a single insulating film. In this case, after an insulating film is deposited, etching of the insulating film may be performed using a resist layer formed on the insulating film by utilization of half-tone exposure. Thereby, a contact hole is formed in the insulating film so as to expose the drain electrode 9d, while the surface of part of the insulating film overlying the metal oxide layer 7B (a portion which is to form the dielectric layer of the storage capacitance 20) is exposed. Thereafter, a resistance-reduction treatment is performed using the resist layer as a mask through the insulating film (exposed portion of the insulating film) such that the resistance of the metal oxide layer 7B underlying the insulating film is reduced.

When viewed in a direction normal to the substrate 1, the gate line G may include a first portion and a second portion whose width is smaller than that of the first portion. The channel region of the oxide semiconductor layer 7A of the TFT 10 is arranged so as to overlap with the first portion of the gate line G. As shown in the drawing, the entire oxide semiconductor layer 7A may overlap with the first portion of the gate line G. In this case, the gate line G also functions as a light-shielding film for the oxide semiconductor layer 7A. Therefore, the variation of the TFT characteristics which is attributed to incidence of light on the oxide semiconductor layer 7A can be suppressed. Further, by decreasing the width of a portion of the gate line G which does not extend over the TFT 10, decrease of the aperture ratio which is attributed to the gate line G can be suppressed. The metal oxide layers 7B of the two pixel regions Pix1, Pix2 adjoining each other in the column direction may be integrally formed so as to overpass the second portion of the gate line G(m) which is present between these pixel regions Pix.

The gate electrode 3 only needs to be electrically connected to the gate line G but may be formed by the same electrically-conductive film as the gate line G. The gate electrode 3 may be integrally formed with the gate line G. For example, the gate electrode 3 may be part of the gate line G. That is, part of the gate line G extending over the channel region of the oxide semiconductor layer 7A of the TFT 10 may function as the gate electrode 3. When viewed in a direction normal to the substrate 1, the gate line G includes a portion extending in a predetermined direction and an extension extending from that portion in a direction different from the predetermined direction. The extension may function as the gate electrode 3.

The source electrode 9s and the drain electrode 9d may be formed by the same electrically-conductive film as the source line S. The source electrode 9s only needs to be electrically connected to the source line S but may be integrally formed with the source line S. For example, the source electrode 9s may be part of the source line G. That is, part of the source line G which is in contact with the oxide semiconductor layer 7A of the TFT 10 may function as the source electrode 9s. When viewed in a direction normal to the substrate 1, the source line S includes a portion extending in a predetermined direction and an extension extending from that portion in a direction different from the predetermined direction. The extension may function as the source electrode 9s.

In the present embodiment, when viewed in a direction normal to the substrate 1, the source line S extends across the oxide semiconductor layer 7A. Part of the source line S which is in contact with the upper surface of the oxide semiconductor layer 7A functions as the source electrode 9s. Meanwhile, the drain electrode 9d is in contact with the oxide semiconductor layer 7A and extends from the oxide semiconductor layer 7A to the contact portion 17. In this example, the drain electrode 9d extends generally parallel with the source line S and is in contact with the pixel electrode 15 at the contact portion 17.

The oxide semiconductor layer 7A and the metal oxide layer 7B may include, for example, at least one metal element among In, Ga and Zn. In the present embodiment, the oxide semiconductor layer 7A and the metal oxide layer 7B include, for example, an In—Ga—Zn—O based oxide. Here, the In—Ga—Zn—O based oxide is a ternary oxide consisting of In (indium), Ga (gallium) and Zn (zinc). The proportion (composition ratio) of In, Ga and Zn is not particularly limited but includes, for example, In:Ga:Zn=2:2:1, In:Ga:Zn=1:1:1, and In:Ga:Zn=1:1:2. The oxide semiconductor layer 7A and the metal oxide layer 7B which have such a composition can be formed by an oxide semiconductor film which includes an In—Ga—Zn—O based semiconductor. The In—Ga—Zn—O based semiconductor may be amorphous or may be crystalline. As the crystalline In—Ga—Zn—O based semiconductor, a crystalline In—Ga—Zn—O based semiconductor in which the c-axis is oriented generally perpendicular to the layer surface is preferred. The crystalline structure of the crystalline In—Ga—Zn—O based semiconductor is disclosed in, for example, Japanese Laid-Open Patent Publication No. 2012-134475. The entire disclosure of Japanese Laid-Open Patent Publication No. 2012-134475 is incorporated by reference in this specification. A TFT which includes an In—Ga—Zn—O based semiconductor layer has high mobility (20 times or more as compared with an a-Si TFT) and low current leakage (less than 1/100 as compared with an a-Si TFT), and is therefore suitably used as a driver TFT and a pixel TFT.

The oxide semiconductor layer 7A and the metal oxide layer 7B may include a different oxide instead of the In—Ga—Zn—O based oxide. For example, the oxide semiconductor layer 7A and the metal oxide layer 7B may include a Zn—O based oxide (ZnO), an In—Zn—O based oxide (IZO), a Zn—Ti—O based oxide (ZTO), a Cd—Ge—O based oxide, a Cd—Pb—O based oxide, an In—Sn—Zn—O based oxide (e.g., $In_2O_3$—$SnO_2$—ZnO), an In—Ga—Sn—O based oxide, or the like.

Now, the effects achieved by the present embodiment are described more specifically by comparison with a conventional TFT substrate and a TFT substrate of a reference example.

First, as the conventional TFT substrate, a TFT substrate disclosed in Patent Document 2 is described.

FIGS. 8(a) and 8(b) are a plan view and a cross-sectional view, respectively, of the TFT substrate disclosed in Patent Document 2. Although the TFT substrate includes a plurality of pixels, only one pixel is shown here.

As shown in the drawings, the TFT substrate includes a source line S and a gate line G. In each pixel defined by the source line S and the gate line G, a TFT 40 and a pixel electrode 45 are provided. The TFT 40 includes a gate electrode 33, a gate insulating layer 35, and a channel portion 37c, a source portion 37s and a drain portion 37d which are provided on the gate insulating layer 35. The channel portion 37c, the source portion 37s and the drain portion 37d of the TFT 40 and the pixel electrode 45 are integrally formed by the same oxide semiconductor film. Specifically, the resistance of the oxide semiconductor film is partially reduced, and such resistance-reduced portions are used as the pixel electrode 45, the source portion 37s, and the drain portion 37d. The resistance-reduction treatment on the oxide semiconductor film is carried out using a protective insulating film 42 as a mask.

In the TFT substrate disclosed in Patent Document 2, when registration of the mask in reduction of the resistance of the oxide semiconductor film is considered, there is a probability that the area of the pixel electrode is much smaller than the area of the pixel region defined by the source line S and the gate line G. Therefore, it is difficult to realize a high aperture ratio.

Figure 8:
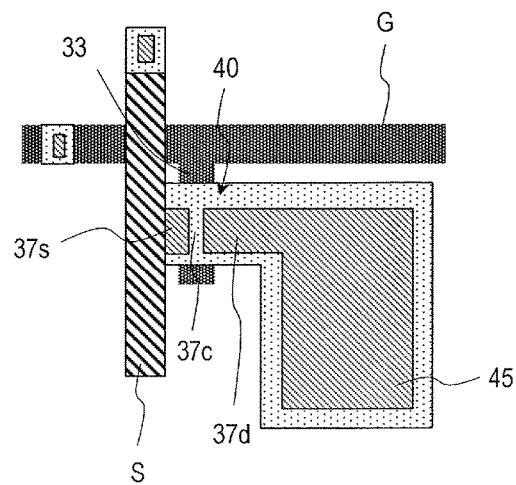
FIGS. 8 (a) and (b) are respectively a plan view and cross-sectional view of a TFT substrate disclosed in Patent Document 2.
Figure 8:
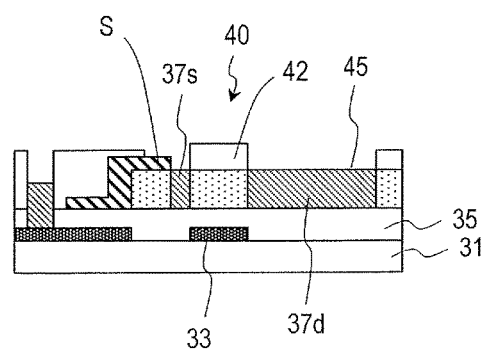

Next, a configuration where storage capacitance 30 is provided in the TFT substrate shown in FIG. 8 is described.

Figure 9:
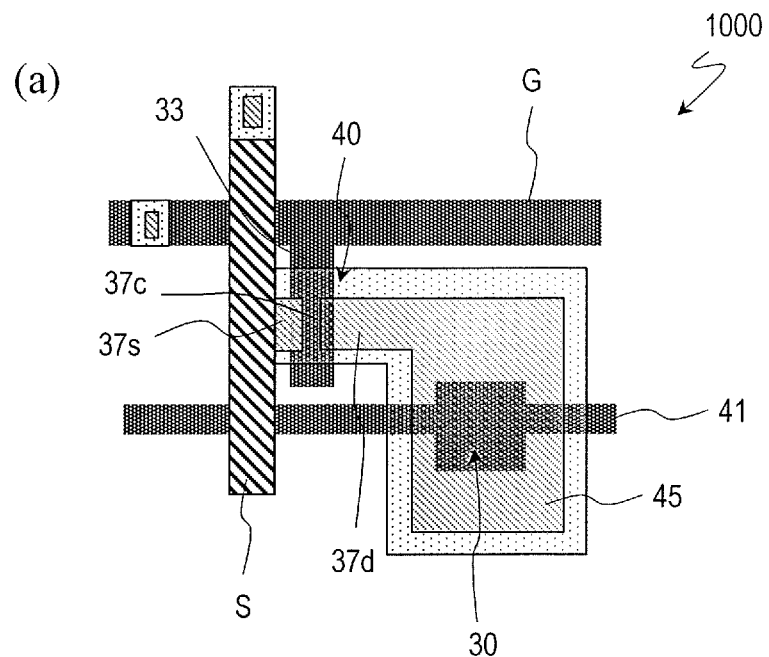
FIG. 9 (a) is a plan view showing one pixel in a TFT substrate of a reference example which is realized by providing a storage capacitance wire in a conventional TFT substrate. (b) is a plan view showing one pixel of a TFT substrate 101 of the first embodiment.
Figure 9:
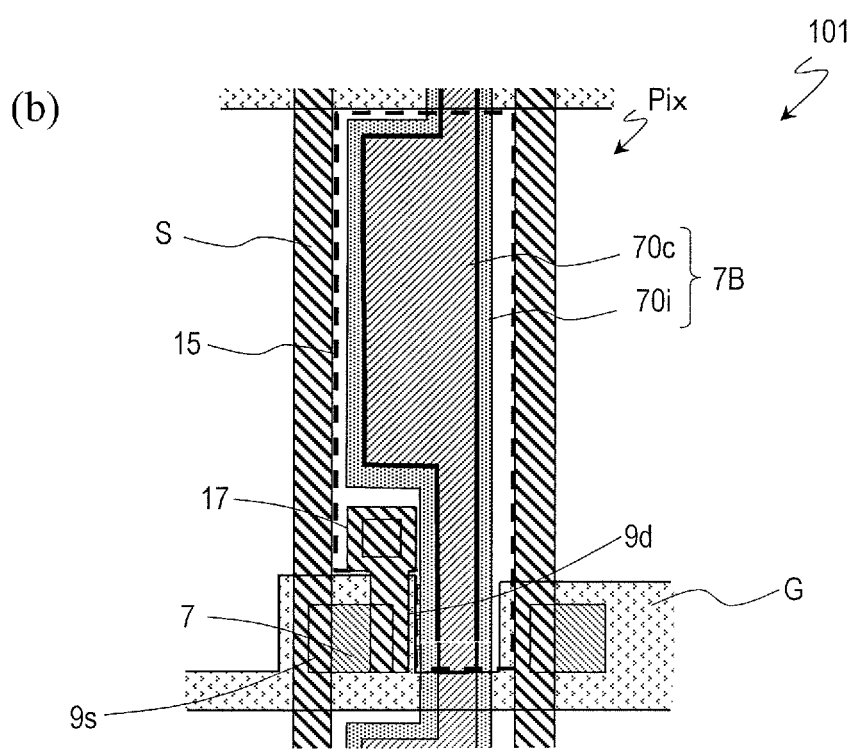

FIG. 9(a) is a plan view showing a TFT substrate 1000 of a reference example which is realized by providing the storage capacitance 30 in a conventional TFT substrate disclosed in Patent Document 2 (FIG. 8). Components which are equivalent to those of FIG. 8 are designated by the same reference numerals. FIG. 9(b) is a plan view of the TFT substrate 101 of the present embodiment, showing only one of the pixel regions Pix illustrated in the plan view of FIG. 1(a).

As shown in FIG. 9(a), the TFT substrate 1000 of the reference example includes a lower layer electrode (storage capacitance wire) 41. A portion in which the lower layer electrode 41 overlaps with the pixel electrode 45 with an insulating film interposed therebetween forms the storage capacitance 30.

The lower layer electrode 41 is formed by, for example, the same electrically-conductive film (metal film) as the gate line G. In this case, the aperture ratio decreases due to formation of the storage capacitance 30. Particularly when the area of the storage capacitance 30 is increased, the aperture ratio decreases according to the increase of that area. Therefore, it is difficult to secure a high aperture ratio.

Alternatively, in some cases, the lower layer electrode 41 is formed using a different electrically-conductive film from the gate line G. For example, it is possible that a lower layer electrode (transparent electrode) 41 is formed by a transparent electrically-conductive film under the pixel electrode 45. This enables to suppress the decrease of the aperture ratio which is attributed to the storage capacitance 30. However, to form the lower layer electrode (transparent electrode) 41, it is necessary to add the process of forming and patterning a transparent electrically-conductive film.

In the case where the lower layer electrode 41 is formed using a transparent electrode film, it is necessary to provide a CS contact section in part of the TFT substrate surrounding a display region in which a plurality of pixel regions are provided, i.e., in the peripheral region, for the purpose of supplying a storage capacitance voltage to the lower layer electrode 41. In the CS contact section, for example, the lower layer electrode 41 extended to the peripheral region is connected to a metal wire (common signal wire) through which a storage capacitance voltage is supplied from an external device. The metal wire may be, for example, a metal wire which is formed by the same metal film as the gate line G (or the source line S).

In the case where a storage capacitance wire is thus provided in a conventional TFT substrate, if a storage capacitance electrode is formed using the same electrically-conductive film as the gate line G, there is the demerit of decreasing the aperture ratio. On the other hand, if a storage capacitance electrode is formed using a separately-formed transparent electrically-conductive film, there is the demerits of increasing the mask process and complicating the manufacturing process. Although in FIG. 8 and FIG. 9 the description has been presented with reference to the TFT substrate disclosed in Patent Document 2, the same demerits also arise in the case where storage capacitance is provided in a different conventional TFT substrate for use in a VA mode liquid crystal display device.

On the other hand, in the present embodiment, an oxide film which is the same as the oxide semiconductor layer 7A is utilized. Therefore, a lower layer electrode (conductor region 70c) of the storage capacitance 20 can be formed without complicating the process. Since the lower layer electrode is transparent, formation of the storage capacitance 20 which has a desired area is possible without decreasing the aperture ratio. Since a lower layer electrode (storage capacitance electrode) which has a larger area than conventional electrodes can be formed, a sufficient storage capacitance value can be secured. For example, in the plan view shown in FIG. 9(b), the conductor region 70c in the pixel region Pix is shown by a thick line. As seen from this drawing, it is possible that the conductor region 70c which is to be the lower layer electrode of the storage capacitance 20 is provided, and the storage capacitance 20 is formed, generally entirely over part of the pixel region Pix defined by the source line S and the gate line G which does not overlap with the electrodes 9s, 9d, the lines S, G and the contact portion 17.

Further, according to the present embodiment, electrical connection between the conductor region (storage capacitance electrode) 70c and a common signal wire can easily be secured. Hereinafter, the description is provided with reference to FIG. 10.

Figure 10:
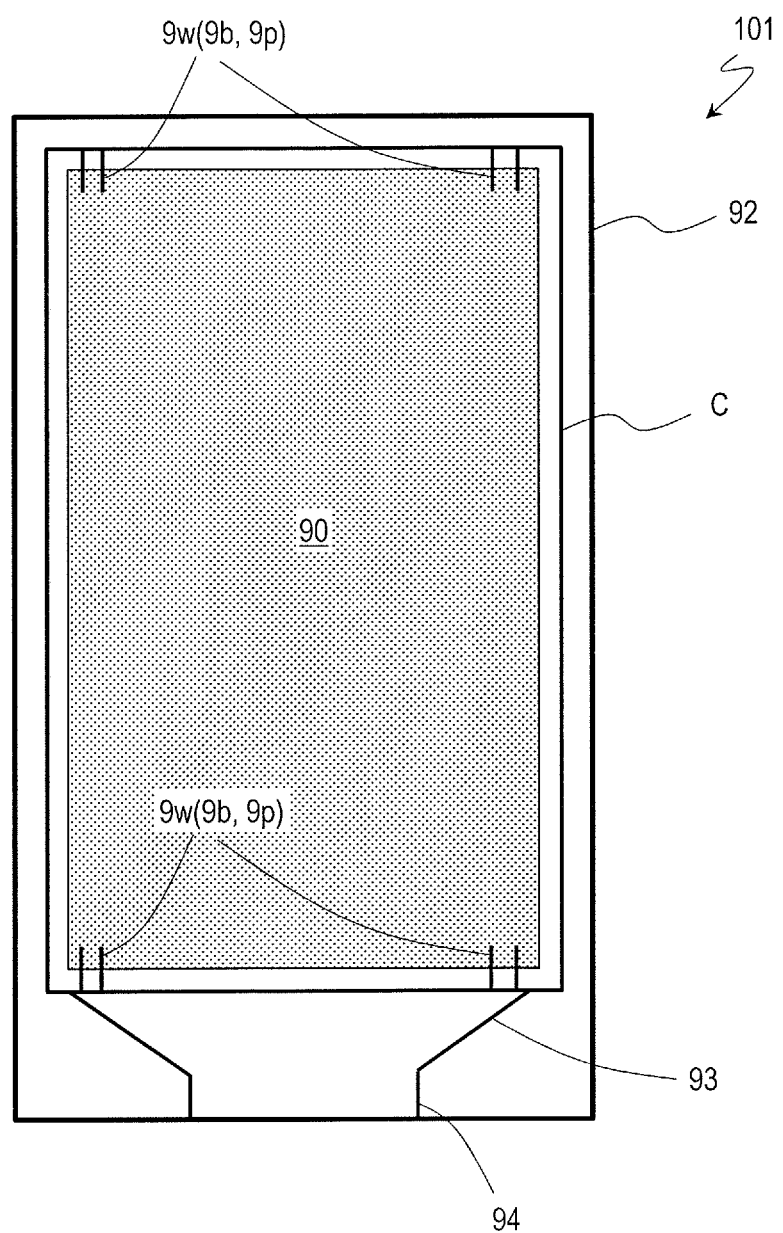
FIG. 10 A schematic plan view showing an example of the TFT substrate 101.

FIG. 10 is a schematic plan view of a TFT substrate 101. The TFT substrate 101 has a display region 90 which includes a plurality of pixel regions and a region 92 other than the display region (peripheral region). In the peripheral region 92, a common signal wire C is provided so as to surround the display region 90. The common signal wire C is connected to a storage capacitance electrode (not shown) of each pixel. The common signal wire C is supplied with a common signal from an external device via a terminal section 94. In the present embodiment, the conductor regions (storage capacitance electrodes) 70c of the pixel electrodes in each column may be integrally formed and connected to the common signal wire C via wires 9w. The wires 9w and the common signal wire C may be integrally formed using the same electrically-conductive film as the source line S. In this case, the conductor region (storage capacitance electrode) 70c of each pixel can be electrically connected to the common signal wire C provided in the peripheral region 92. The terminal section 94 may be formed by the same electrically-conductive film as the gate line G. A wire 93 which connects the terminal section 94 to the common signal wire C may be integrally formed with the common signal wire C and connected to the terminal section 94 (or a wire integrally formed with the terminal section 94) in a contact hole formed in the gate insulating layer. In embodiments which will be described later, instead of the wires 9w, a connecting wire 9b or connecting portion 9p is integrally formed with the common signal wire C, whereby electrical connection between the common signal wire C and the storage capacitance electrode can be secured as in the present embodiment.

As described above, according to the present embodiment, the demerits which are caused by formation of storage capacitance in conventional TFT substrates can be removed. That is, the storage capacitance 20 which has a desired area can be formed through a simple process while decrease of the aperture ratio is suppressed.

Figure 2:
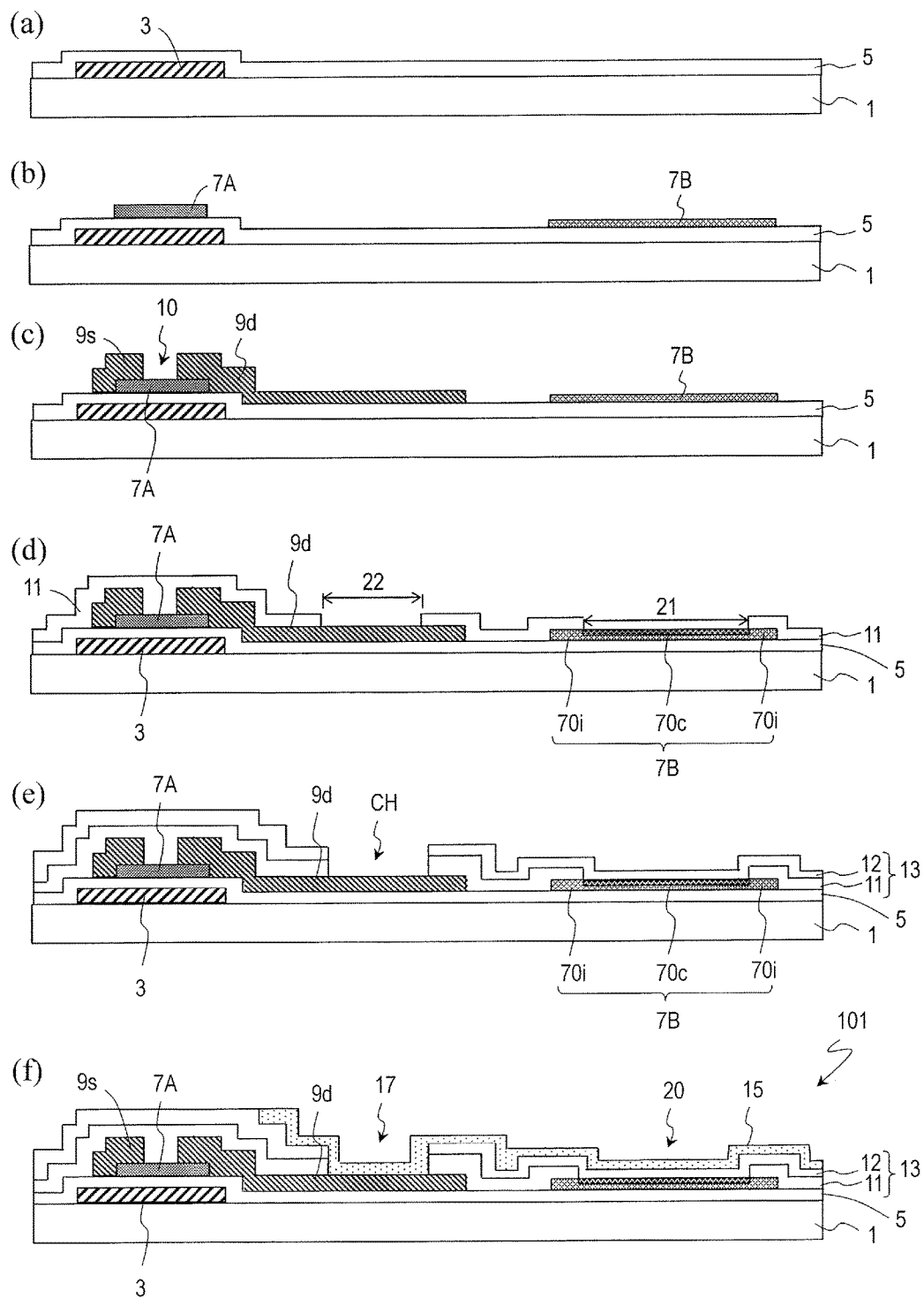
FIG. 2 (a) to (f) are cross-sectional views for illustrating stepwise a manufacturing method of the semiconductor device 101 of the first embodiment.

Next, an example of a manufacturing method of a semiconductor device (TFT substrate) 101 of the present embodiment is described with reference to FIG. 2. FIGS. 2(a) to 2(f) are cross-sectional views for illustrating the steps of a manufacturing method of the TFT 10 and the storage capacitance 20 in the TFT substrate 101. These cross-sectional views correspond to the cross section taken along line A-A' of FIG. 1(a).

First, as shown in FIG. 2(a), a metal film for the gate is formed on the substrate 1 and then patterned through a known photolithography process. Thereby, a gate wire layer which includes a gate electrode 3 and a gate line (not shown) is formed. Then, a gate insulating layer 5 is formed so as to cover the gate wire layer.

A substrate which is transparent and insulative can be used as the substrate 1. Here, a glass substrate is used.

The material of an electrode film for the gate is not particularly limited. A film which includes a metal, such as aluminum (Al), tungsten (W), molybdenum (Mo), tantalum (Ta), chromium (Cr), titanium (Ti), copper (Cu), or the like, or an alloy thereof, may be appropriately used. Alternatively, a multilayer film consisting of a plurality of such films may be used. Here, a multilayer film (W/TaN), consisting of a W film (thickness: 300 nm) as the upper layer and a TaN film (thickness: 30 nm) as the lower layer, is used as the electrode film for the gate.

The gate insulating layer 5 used may be, for example, a silicon oxide ($SiO_2$) layer or a silicon nitride ($SiN_x$) layer. Here, the gate insulating layer 5 used is a multilayer film consisting of a silicon oxide ($SiO_2$) layer (thickness: 50 nm) as the upper layer and a silicon nitride ($SiN_x$) layer (thickness: 325 nm)) as the lower layer.

Then, as shown in FIG. 2(b), an oxide semiconductor film is formed on the gate insulating layer 5 by sputtering and then patterned so as to obtain an oxide semiconductor layer 7A and a metal oxide layer 7B. The oxide semiconductor layer 7A is arranged so as to overlap with the gate electrode (gate line G) with the gate insulating layer 5 interposed therebetween. Here, the oxide semiconductor film used is, for example, an In—Ga—Zn—O based semiconductor film (thickness: 50 nm). The thickness of the oxide semiconductor film may be, for example, not less than 30 nm and not more than 60 nm.

Thereafter, an electrode film for the source is formed by, for example, sputtering so as to cover the oxide semiconductor layer 7A and the metal oxide layer 7B. Then, as shown in FIG. 2(c), the electrode film for the source is patterned through a known photolithography process, whereby a source wire layer which includes a source electrode 9s, a drain electrode 9d, and a source line (not shown) is formed. The source electrode 9s and the drain electrode 9d are arranged so as to be in contact with the oxide semiconductor layer 7A. In this way, the TFT 10 is formed.

The material of the electrode film for the source is not particularly limited. A film which includes a metal, such as aluminum (Al), tungsten (W), molybdenum (Mo), tantalum (Ta), copper (Cu), chromium (Cr), titanium (Ti), or the like, or an alloy thereof, or a metal nitride thereof, may be appropriately used. Here, a multilayer film (Ti/Al/Ti), including a Ti film (thickness: 30 nm), an Al film (200 nm) and a Ti film (100 nm) in this order from the substrate 1 side is used as the electrode film for the source.

Then, as shown in FIG. 2(d), a first insulating film 11 is formed so as to cover the source wire layer and the metal oxide layer 7B. For example, a $SiO_2$ layer may be used as the first insulating film 11. The thickness of the first insulating film 11 is not particularly limited. However, if the thickness of the first insulating film 11 is not less than 200 nm, for example, the first insulating film 11 can function as a mask more surely in the resistance-reduction step. On the other hand, the thickness of the first insulating film 11 is preferably not more than 500 nm for saving the space of the TFT substrate. Here, for example, a $SiO_2$ layer (thickness: 300 nm) is used as the first insulating film 11.

Thereafter, an opening 21 through which part of the metal oxide layer 7B is to be exposed and an opening 22 through which part of the drain electrode 9d is to be exposed are formed in the first insulating film 11. Then, the substrate 1 is exposed to a reductive plasma or a plasma including a doping element (resistance-reduction treatment). Here, the substrate 1 is exposed to argon plasma which is a reductive plasma. As a result, the resistance decreases near the surface of part of the metal oxide layer 7B which is exposed through the opening 21. This resistance-reduced portion forms a conductor region 70c. A region of the metal oxide layer 7B which is masked with the first insulating film 11 and of which the resistance is not reduced remains as a semiconductor region 70i. The electric resistance of the conductor region 70c is lower than that of the semiconductor region 70i and may be, for example, not more than $1 \times 10^{-2}$ Ωcm. The thickness of the conductor region 70c can vary depending on the conditions of the resistance-reduction treatment. A specific procedure for the resistance-reduction treatment (plasma treatment) and the mechanism of reducing the electric resistance of the oxide semiconductor by the treatment are disclosed in, for example, Patent Document 2. The entire disclosure of Patent Document 2 is incorporated by reference in this specification.

Then, as shown in FIG. 2(e), a second insulating film 12 is formed on the first insulating film 11 and in the openings 21, 22. Then, part of the second insulating film 12 which is present in the opening 22 is removed through a known photolithography process. Thereby, a contact hole CH is formed which penetrates through the first and second insulating films 11, 12 and through which the drain electrode 9d is exposed.

As the second insulating film 12, for example, a silicon nitride (SiNx) film, a silicon oxide (SiOx) film, a silicon oxynitride (SiOxNy; x>y) film, a silicon nitroxide (SiNxOy; x>y) film, or the like, can be appropriately used. In the present embodiment, the second insulating film 12 is also used as a capacitive insulating film which is a constituent of the storage capacitance, and therefore, appropriately selecting the material and thickness of the second insulating film 12 so as to achieve predetermined capacitance $C_{CS}$ is preferred. For example, SiNx is preferably used from the viewpoint of dielectric constant and insulation. The thickness of the second insulating film 12 is, for example, not less than 70 nm and not more than 180 nm. When the thickness of the second insulating film 12 is not less than 70 nm, insulation is secured more surely. When the thickness of the second insulating film 12 is not more than 180 nm, desired capacitance $C_{cs}$ is achieved more surely. Here, a SiN film (thickness: 100 nm) is used as the second insulating film 12.

Then, as shown in FIG. 2(f), a transparent electrically-conductive film is formed on the second insulating film 12 and in the contact hole CH and patterned through a known photolithography process, whereby a pixel electrode 15 is formed. The pixel electrode 15 is arranged so as to overlap with the conductor region 70c of the metal oxide layer 7B with the second insulating film 12 interposed therebetween. Thereby, a storage capacitance 20 is formed in which the conductor region 70c serves as the lower layer electrode, the second insulating film 12 serves as the dielectric layer, and the pixel electrode 15 serves as the upper layer electrode.

As the transparent electrically-conductive film, for example, an ITO (indium tin oxide) film, an IZO film, a ZnO film (zinc oxide film) or the like, can be used. Here, an ITO film (thickness: 100 nm) is used as the transparent electrically-conductive film.

In this way, a TFT substrate 101 which includes the TFT 10 and the storage capacitance 20 in the pixel region Pix is obtained.

Second Embodiment

Hereinafter, the second embodiment of the semiconductor device of the present invention is described. The present embodiment is different from the TFT substrate 101 of the first embodiment in that the conductor regions 70c which are present in two pixel regions adjoining each other in the column direction are electrically connected to each other using a connecting wire.

Figure 3:
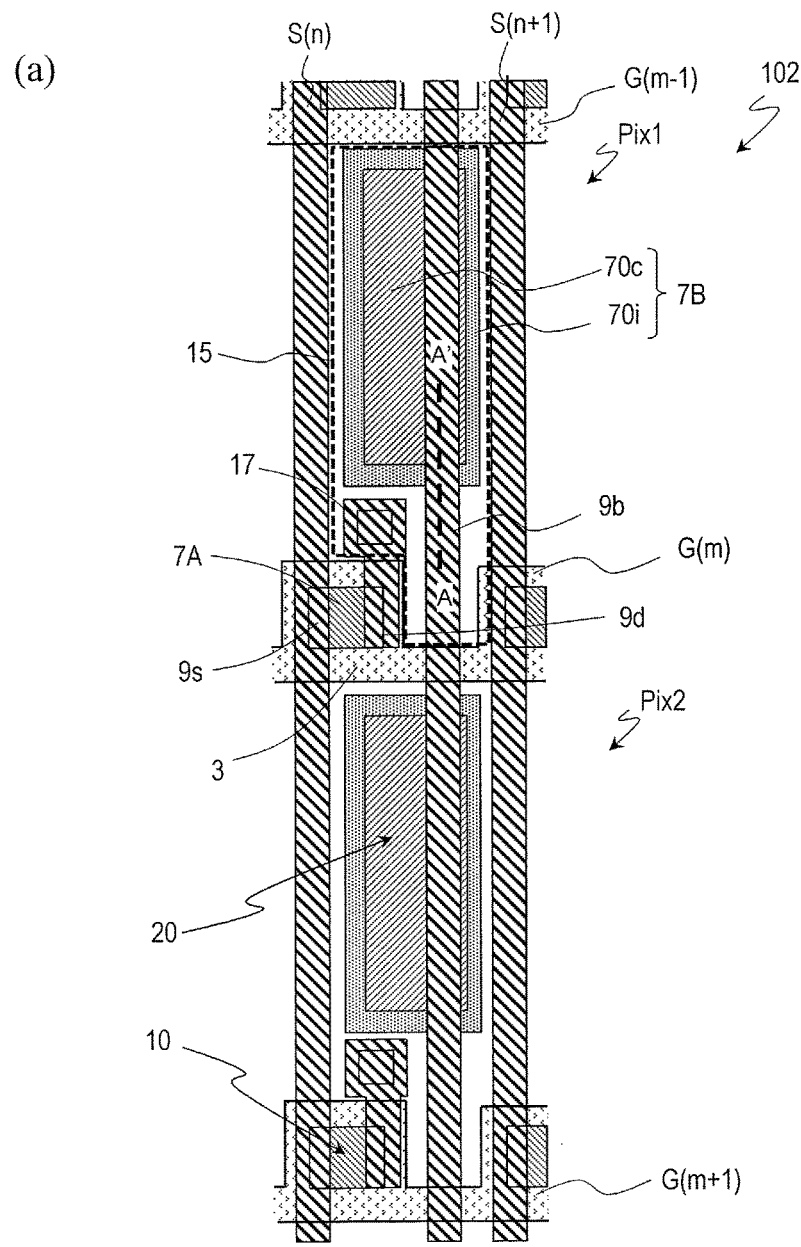
FIGS. 3 (a) and (b) are respectively a plan view and cross-sectional view of a semiconductor device 102 of the second embodiment of the present invention.
Figure 3:
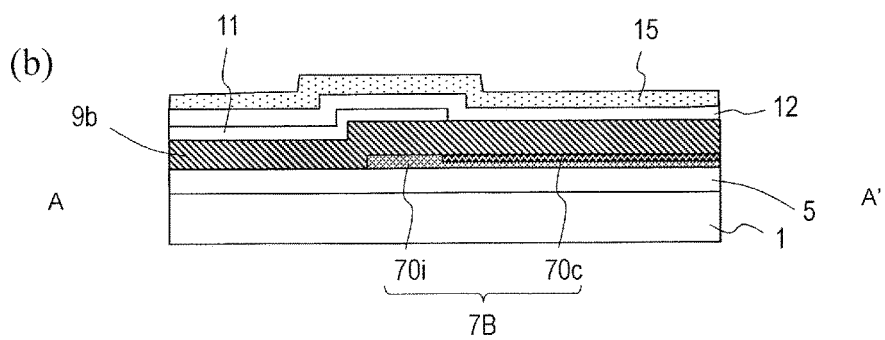

FIG. 3(a) is a plan view of a semiconductor device (TFT substrate) 102 of the present embodiment. Of a plurality of pixel regions Pix which are two-dimensionally arranged over the TFT substrate 102, two pixel regions Pix1, Pix2 adjoining each other in the column direction are shown in FIG. 3(a).

FIG. 3(b) is a cross-sectional view taken along line A-A' of FIG. 3(a), showing part of the storage capacitance 20 in the TFT substrate 102. In FIGS. 3(a) and 3(b), components which are equivalent to those of FIGS. 1(a) and 1(b) are designated by the same reference numerals, and the descriptions thereof are herein omitted. Further, in the present embodiment, the cross-sectional structure of the TFT is equivalent to that shown in FIG. 1(b), and the illustration thereof is herein omitted.

In the TFT substrate 102, the metal oxide layers 7B which are present in the pixel regions Pix1, Pix2 are formed separately from each other.

The TFT substrate 102 includes a connecting wire 9b which is formed by the same electrically-conductive film as the source electrode 9s and the source line S. The connecting wire 9b is arranged so as to extend in the column direction across the first and second pixel regions Pix1, Pix2 and electrically connect the conductor regions 70c of the metal oxide layers 7B which are present in the pixel regions Pix1, Pix2 with each other. When viewed in a direction normal to the substrate 1, the connecting wire 9b may be arranged so as to overpass a plurality of gate lines G.

The connecting wire 9b that connects the conductor regions 70c of the metal oxide layers 7B which are present in the first and second pixel regions Pix1, Pix2 extends so as to overpass the gate line G(m) as shown in the drawing. Note that, when viewed in a direction normal to the substrate 1, the connecting wire 9b may be arranged so as to extend across a plurality of pixel regions Pix in each column such that the conductor regions 70c of all of the pixel regions Pix in that column are electrically connected together.

As shown in the drawing, the gate line G(m) may include the first portion that overlaps with at least a part of the oxide semiconductor layer 7A of the TFT 10 and the second portion whose width is smaller than that of the first portion. The connecting wire 9b may be arranged so as to overpass the second portion of the gate line G(m).

Also in the present embodiment, the conductor region 70c of the metal oxide layer 7B functions as the lower layer electrode of the storage capacitance 20 as in the first embodiment. The connecting wire 9b is formed using the same electrically-conductive film as the source line S. Therefore, the storage capacitance 20 and the connecting wire 9b can be formed without complicating the manufacturing process. Since the storage capacitance 20 is made of a transparent material, decrease of the aperture ratio which is attributed to the storage capacitance 20 can be suppressed. Since the area of the storage capacitance 20 can be increased without decreasing the aperture ratio, a desired storage capacitance value can be secured.

Further, according to the present embodiment, the following effects can also be achieved.

In the previously-described first embodiment, the metal oxide layer 7B extends in the column direction so as to overpass the gate line G. However, when such a configuration is applied to a high-definition panel whose pixel pitch is small, it is difficult to arrange the TFT 10 and the metal oxide layer 7B so as to be sufficiently separated from each other. Particularly in the pixel region Pix, the gap between the TFT 10 and the metal oxide layer 7B is narrow in a region of the TFT 10 on the source line S(n+1) side. If the width of the metal oxide layer 7B is decreased for the purpose of increasing this gap, it will be difficult to connect together, with a small resistance, the conductor regions 70c of the metal oxide layers 7B which are present in the pixel regions Pix1, Pix2.

On the other hand, in the present embodiment, the metal oxide layers 7B which are present in the first and second pixel regions Pix1, Pix2 have such a pattern that they are separated from each other. Therefore, the metal oxide layers 7B of the pixel regions Pix1, Pix2 can be arranged so as to be sufficiently separated from the contact portion 17 and the TFT 10. Further, the conductor regions 70c of the metal oxide layers 7B which are present in the first and second pixel regions Pix1, Pix2 can be connected using the connecting wire 9b which is formed by the electrode film for the source and which has lower resistance. Thus, the resistance of the storage capacitance electrode can be reduced, and the load can be decreased, as compared with the first embodiment.

In the present embodiment, the aperture ratio is smaller than that of the first embodiment by the connecting wire 9b. However, since the area of the connecting wire 9b is much smaller than the area of the storage capacitance 20, the aperture ratio of the TFT substrate can be high as compared with a case where the storage capacitance wire is formed using the same electrically-conductive film as the gate line G (the aperture ratio decreases according to the area of the storage capacitance 20).

Next, an example of the manufacturing method of the TFT substrate 102 is described with reference to the drawings.

FIGS. 4(a) to 4(d) are cross-sectional views for illustrating stepwise the manufacturing method of the TFT substrate 102.

First, as previously described with reference to FIGS. 2(a) and 2(b), a gate electrode 3, a gate insulating layer 5, an oxide semiconductor layer 7A and a metal oxide layer 7B are formed on a substrate 1.

Then, as shown in FIG. 4(a), an electrode film for the source is formed and patterned such that a connecting wire 9b is formed in addition to a source electrode 9s, a drain electrode 9d, and a source line (not shown). The connecting wire 9b is formed on part of the metal oxide layer 7B in each of the pixel regions Pix. Specifically, the connecting wire 9b is formed on part of a region of the metal oxide layer 7B which is to form a conductor region. In this step, part of the metal oxide layer 7B which is in contact with the connecting wire 9b comes into contact with the connecting wire 9b (metal) so that its resistance decreases, and accordingly becomes a conductor region 70c. To realize this decrease of the resistance, the material of the connecting wire 9b (the material of the electrode film for the source) is preferably a metal whose standard electrode potential is lower than that of a metal included in the metal oxide layer 7B. When the metal oxide layer 7B is an In—Ga—Zn—O based oxide layer, for example, a metal whose standard electrode potential is lower than that of In, such as Ti, Mo, or Al, can be used.

Thereafter, as shown in FIG. 4(b), a first insulating film 11 which has openings 21 and 22 is formed. Then, a resistance-reduction treatment (plasma treatment) is performed such that the resistance of part of the metal oxide layer 7B which is exposed through the opening 21 of the first insulating film 11 is reduced. The material and thickness of the first insulating film 11 and the procedure of the resistance-reduction treatment may be the same as those previously described with reference to FIG. 2(d).

Thereby, the resistance of part of the metal oxide layer 7B which is exposed through the opening 21 and which is not in contact with the connecting wire 9b is reduced. As a result, a conductor region 70c is formed in a region of the metal oxide layer 7B which is exposed through the opening 21. The conductor region 70c includes a portion of which the resistance is reduced by this step and a portion which is in contact with the connecting wire 9b.

Thereafter, as shown in FIG. 4(c) and FIG. 4(d), a second insulating film 12 and a pixel electrode 15 are formed, whereby a TFT substrate 102 is obtained. The step of forming the second insulating film 12 and the pixel electrode 15 is the same as that previously described with reference to FIG. 2(e) and FIG. 2(f).

Figure 4:
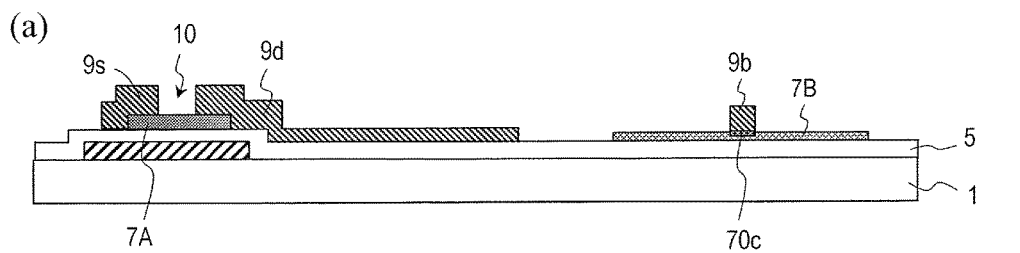
FIG. 4 (a) to (d) are cross-sectional views for illustrating stepwise a manufacturing method of the semiconductor device 102 of the second embodiment.
Figure 4:
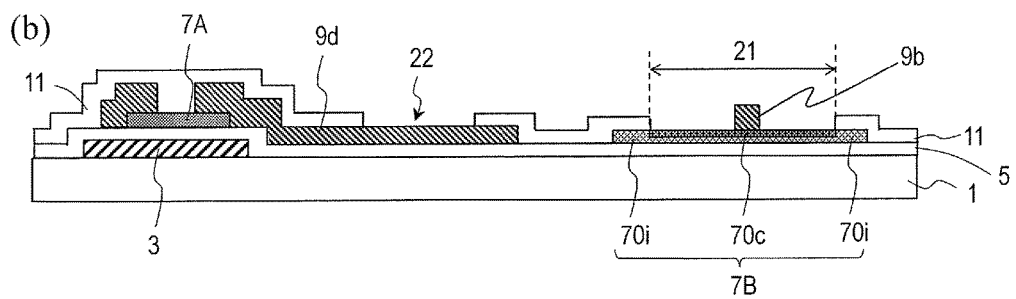
Figure 4:
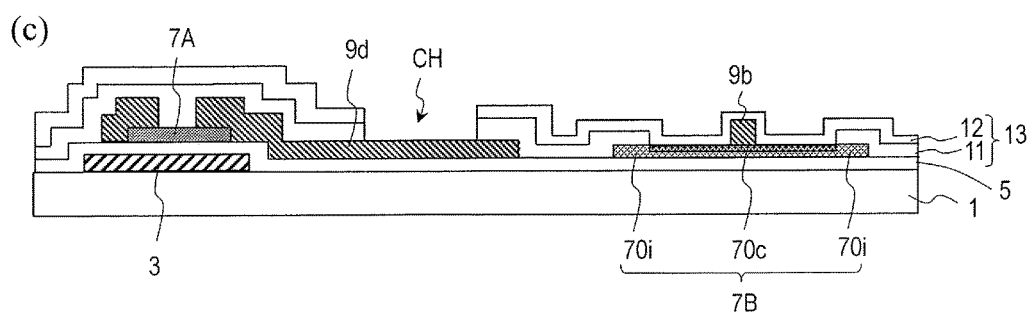
Figure 4:
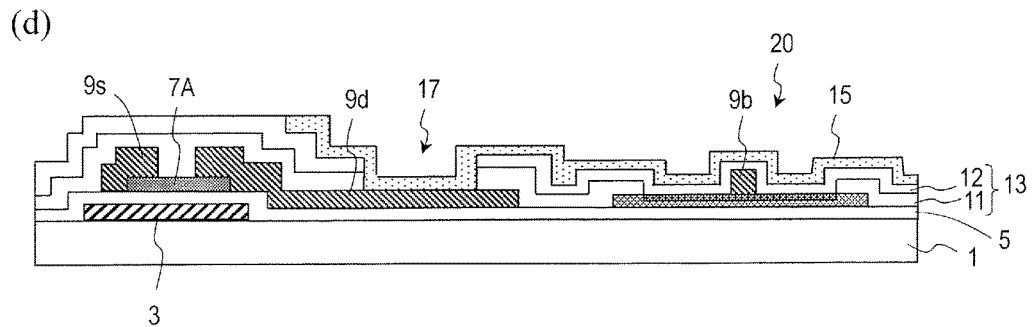

The manufacturing method of the TFT substrate 102 is not limited to the method illustrated in FIG. 4. For example, it is possible that the TFT 10 is a so-called etch-stop structure TFT in which an etch-stop film is provided over the channel region, and the resistance of the metal oxide layer 7B is reduced by utilization of the etch-stop film.

First, as previously described with reference to FIGS. 2(a) and 2(b), a gate electrode 3, a gate insulating layer 5, an oxide semiconductor layer 7A and a metal oxide layer 7B are formed on a substrate 1.

Figure 5:
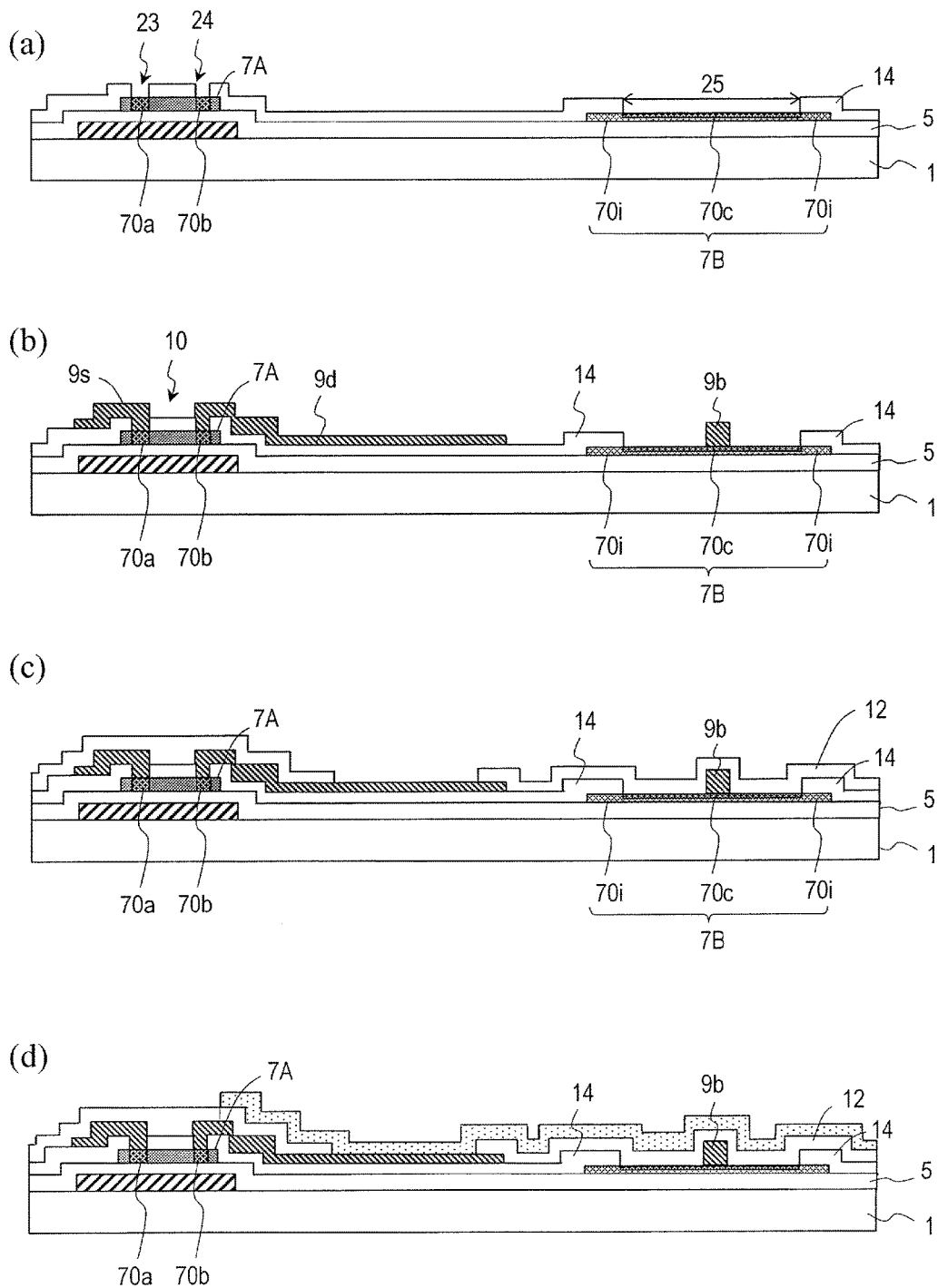
FIG. 5 (a) to (d) are cross-sectional views for illustrating stepwise another manufacturing method example of the semiconductor device 102 of the second embodiment.

Then, as shown in FIG. 5(a), an etch-stop film 14 is formed so as to cover the oxide semiconductor layer 7A and the metal oxide layer 7B. Thereafter, openings 23, 24 through which regions of the oxide semiconductor layer 7A on opposite sides of the channel region are exposed and an opening 25 through which part of the metal oxide layer 7B is exposed are formed in the etch-stop film 14.

Then, a resistance-reduction treatment is performed in the same way as that of the previously-described embodiment. Thereby, the resistance of part of the oxide semiconductor layer 7A which is exposed through the openings 23, 24 of the etch-stop film 14 and the resistance of part of the metal oxide layer 7B which is exposed through the opening 25 of the etch-stop film 14 are reduced so that these parts form conductor regions 70a, 70b, 70c. A region of the oxide semiconductor layer 7A and the metal oxide layer 7B of which the resistance is not reduced remains as a semiconductor region 70i.

Thereafter, as shown in FIG. 5(b), an electrode film for the source is formed on the etch-stop film 14 and in the openings 23, 24, 25 and patterned so as to form a source electrode 9s, a drain electrode 9d, a source line (not shown) and a connecting wire 9b. The source electrode 9s is arranged so as to be in contact with the conductor region 70a in the opening 23. The drain electrode 9d is arranged so as to be in contact with the conductor region 70b in the opening 24. The connecting wire 9b is arranged so as to be in contact with part of the conductor region 70c in the opening 25. The material and thickness of the electrode film for the source may be the same as those previously described with reference to FIG. 2(c).

Thereafter, as shown in FIG. 5(c) and FIG. 5(d), a second insulating film 12 and a pixel electrode 15 are formed, whereby a TFT substrate 102' is obtained. The step of forming the second insulating film 12 and the pixel electrode 15 is the same as that previously described with reference to FIG. 2(e) and FIG. 2(f). Thus, another TFT substrate 102' of the present embodiment is obtained.

Third Embodiment

Hereinafter, the third embodiment of the semiconductor device of the present invention is described. The present embodiment is different from the TFT substrate 101 of the first embodiment in that the conductor regions 70c which are present in two pixel regions adjoining each other in the column direction are electrically connected to each other using connecting portions.

Figure 6:
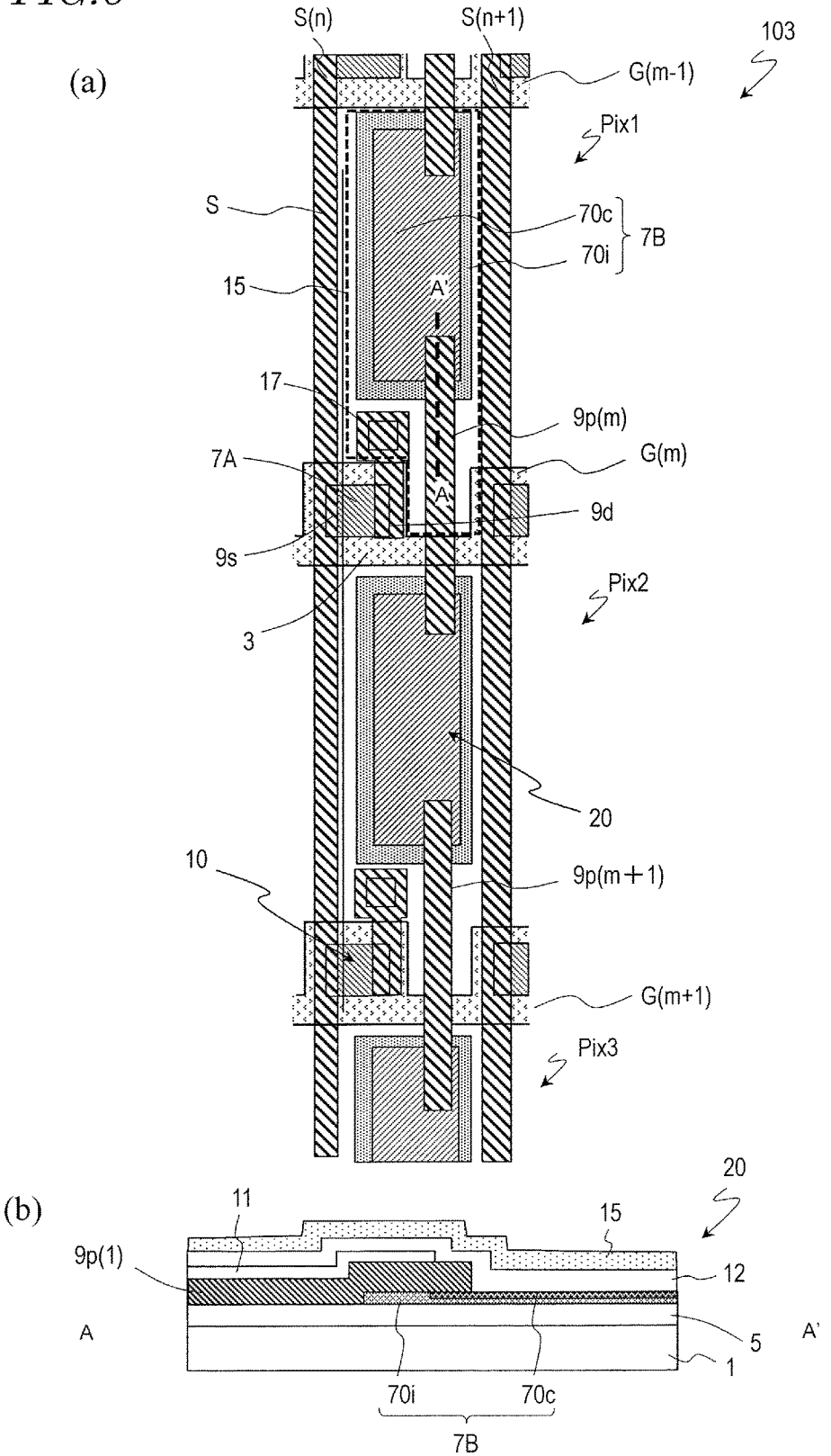
FIGS. 6 (a) and (b) are respectively a plan view and cross-sectional view of a semiconductor device 103 of the third embodiment of the present invention.

FIG. 6(a) is a plan view of a semiconductor device (TFT substrate) 103 of the present embodiment. Of a plurality of pixel regions Pix which are two-dimensionally arranged over the TFT substrate 103, three pixel regions Pix1, Pix2 adjoining one another in the column direction (the first pixel region Pix1, the second pixel region Pix2 and the third pixel region Pix3) are shown in FIG. 6(a).

FIG. 6(b) is a cross-sectional view taken along line A-A' of FIG. 6(a), showing part of the storage capacitance 20 in the TFT substrate 103. In FIGS. 6(a) and 6(b), components which are equivalent to those of FIGS. 1(a) and 1(b) are designated by the same reference numerals, and the descriptions thereof are herein omitted. Further, in the present embodiment, the cross-sectional structure of the TFT is equivalent to that shown in FIG. 1(b), and the illustration thereof is herein omitted.

In the TFT substrate 103, the metal oxide layers 7B which are present in the pixel regions Pix1, Pix2, Pix3 are arranged so as to be separated from one another as in the second embodiment.

The TFT substrate 103 includes a plurality of connecting portions 9p which are formed by the same electrically-conductive film as the source electrode 9s and the source line S. The plurality of connecting portions 9p are separated from each other. Each of the connecting portions 9p is arranged so as to electrically connect together the conductor regions 70c of the metal oxide layers 7B which are present in two pixel regions adjoining each other in the column direction.

Now, the above-described configuration is more specifically described with the pixel regions Pix1 to Pix3 shown in FIG. 6(a). The conductor region 70c of the metal oxide layer 7B which is present in the second pixel region Pix2 is connected to the conductor region 70c of the metal oxide layer 7B which is present in the first pixel region Pix1 via the first connecting portion 9p(m) (m is a natural number) and is electrically connected to the conductor region 70c of the metal oxide layer 7B which is present in the third pixel region Pix3 via the second connecting portion 9p(m+1). The first connecting portion 9p(m) and the second connecting portion 9p(m+1) are arranged so as to be separated from each other. Each of the connecting portions 9p extends so as to overpass a corresponding gate line G. For example, the first connecting portion 9p(m) and the second connecting portion 9p(m+1) extend so as to overpass the gate lines G(m) and G(m+1), respectively.

As shown in the drawings, when viewed in a direction normal to the substrate 1, the gate lines G(m), G(m+1) each may include the first portion that overlaps with at least a part of the oxide semiconductor layer 7A of the TFT 10 and the second portion whose width is smaller than that of the first portion. The first connecting portion 9p(m) and the second connecting portion 9p(m+1) may be arranged so as to overpass the second portions of the gate lines G(m) and G(m+1), respectively.

The plurality of connecting portions 9p may have such a configuration that the connecting wire 9b of the second embodiment is divided above the central portion of each conductor region 70c. Also, each of the connecting portions 9p may be only in contact with the vicinity of edges of two conductor regions 70c that are to be connected.

Also in this embodiment, the conductor region 70c of the metal oxide layer 7B functions as the lower layer electrode of the storage capacitance 20 as in the previously-described embodiments. The connecting portions 9p are formed using the same electrically-conductive film as the source line S. Therefore, the storage capacitance 20 and the connecting portions 9p can be formed without complicating the manufacturing process. Since the storage capacitance 20 is made of a transparent material, decrease of the aperture ratio which is attributed to the storage capacitance 20 can be suppressed. Since the area of the storage capacitance 20 can be increased without decreasing the aperture ratio, a desired storage capacitance value can be secured.

The metal oxide layers 7B which are present in the first and second pixel regions Pix1, Pix2 have such a pattern that they are separated from each other as in the second embodiment. Therefore, the metal oxide layers 7B can be arranged so as to be sufficiently separated from the contact portion 17 and the TFT 10. Further, the conductor regions 70c of the metal oxide layers 7B which are present in the first and second pixel regions Pix1, Pix2 are connected using the connecting portions 9p which are formed by the electrode film for the source and which has lower resistance. Thus, the resistance of the storage capacitance electrode can be reduced, and the load can be decreased, as compared with the first embodiment.

In the present embodiment, the aperture ratio is smaller than that of the first embodiment by the plurality of connecting portions 9p. However, since the area in each of the pixel regions Pix which is necessary for the connecting portions 9p is much smaller than the area of the storage capacitance 20, a high aperture ratio can be realized as compared with a case where the storage capacitance wire is formed by the same electrically-conductive film as the gate line G (the aperture ratio decreases according to the area of the storage capacitance 20). Further, according to the present embodiment, decrease of the aperture ratio which is attributed to formation of the storage capacitance 20 can be suppressed as compared with the second embodiment where the connecting wire 9b is arranged so as to extend across the pixel regions Pix.

Although not shown, when viewed in a direction normal to the substrate 1, the conductor regions 70c of all the pixel regions Pix in each column may be electrically connected together via the connecting portions 9p. This enables to supply a common storage capacitance voltage (Cs voltage) to the conductor regions 70c of the plurality of pixel regions Pix (which function as storage capacitance electrodes) without complicating the wire structure.

The TFT substrate 103 of the present embodiment can be manufactured by the same method as that for the TFT substrate 102 which has previously been described with reference to FIG. 4. Note that, however, in the step of patterning the electrode film for the source (FIG. 4(a)), a plurality of connecting portions 9p which are separated from one another are formed instead of the connecting wire 9b. Also, a TFT substrate including TFTs which have an etch-stop structure can be manufactured by the same method as that previously described with reference to FIG. 5. Note that the cross-sectional structures for illustrating these manufacturing steps are the same as those shown in FIG. 4 and FIG. 5 for the previously-described embodiments except that the connecting portions 9p are formed instead of the connecting wire 9b and are therefore not shown herein.

The above-described TFT substrates 101 to 103 can be used as an active matrix substrate of a liquid crystal display device, for example.

Figure 7:
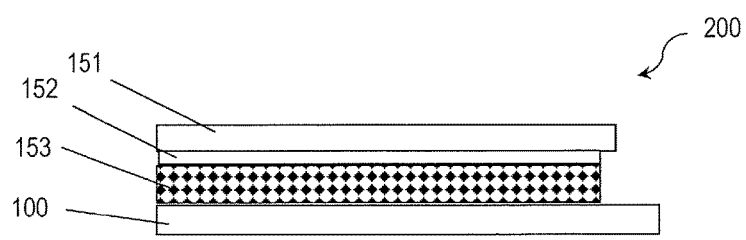
FIG. 7 A cross-sectional view illustrating a display device in which a semiconductor device of an embodiment of the present invention is used.

FIG. 7 is a schematic cross-sectional view showing an example of the configuration of a liquid crystal display device 200 in which the TFT substrates 101 to 103 of the above-described embodiments are used.

The liquid crystal display device 200 includes a TFT substrate 100, a counter substrate (e.g., glass substrate) 151, and a liquid crystal layer 153. The TFT substrate 100 may be any of the above-described TFT substrates 101 to 103. A counter electrode 152 is provided on the liquid crystal layer 153 side of the counter substrate 151. In the liquid crystal display device 200, a voltage is applied across the liquid crystal layer 153 that is present between pixel electrodes 15 of the TFT substrate 100 and the counter electrode 152. When necessary, alignment films (e.g., vertical alignment films) are provided on the liquid crystal layer 153 sides of the pixel electrode 15 and the counter electrode 152.

The liquid crystal display device 200 can be manufactured as described below.

First, a light-shielding film (e.g., a 200 nm thick Ti film) is formed on a glass substrate and patterned into a desired shape through a photolithography process. Thereby, a black matrix is formed. Then, an insulating film (e.g., a 200 nm thick $SiO_2$ film) is formed on the glass substrate in which the black matrix has been formed. Thereafter, a counter electrode 152 is formed on the insulating film. The counter electrode 152 is formed by forming a transparent electrically-conductive film (e.g., a 100 nm thick ITO) by sputtering and patterning the formed film. In this way, a counter substrate 151 is obtained.

Then, photospacers are placed on the TFT substrate 100 (TFT substrates 101 to 103) formed by the method described in the above embodiments before the TFT substrate 100 and the counter substrate 151 are combined together. Then, a liquid crystal is injected into the gap between these substrates 100, 151, whereby a liquid crystal layer 153 is formed. Then, the substrates 100, 151 between which the liquid crystal layer 153 has been formed are cut, whereby a liquid crystal display device 200 is obtained.

The liquid crystal display device 200 is, for example, a vertical alignment mode (VA mode) liquid crystal display device. As a matter of course, the liquid crystal display device of an embodiment of the present invention is not limited to this example but is applicable to, for example, transverse electric field mode liquid crystal display devices in which pixel electrodes and a counter electrode are provided on a TFT substrate, such as In-Plane Switching (IPS) mode and Fringe Field Switching (FFS) mode liquid crystal display devices. The configuration of TFTs in IPS mode and FFS mode liquid crystal display devices is well known and, therefore, the description thereof is herein omitted.

Since the FFS mode liquid crystal display devices and the like have two transparent electrode layers, formation of storage capacitance by utilization of those layers is possible. On the other hand, the VA mode liquid crystal display devices typically have only a single transparent electrode layer (pixel electrode). Therefore, when the above-described embodiment is applied to a VA mode liquid crystal display device, transparent storage capacitance can be formed without adding another transparent electrode layer. Thus, particularly outstanding effects are achieved.

Although the descriptions are presented with examples of liquid crystal display devices in the foregoing sections, the TFT substrates 101 to 103 of the above-described embodiments can be used in other types of display devices, such as organic electroluminescence (EL) display devices, inorganic electroluminescence display devices, and MEMS display devices.

INDUSTRIAL APPLICABILITY

Embodiments of the present invention are applicable to a wide variety of devices which include thin film transistors, including circuit substrates such as active matrix substrates, display devices such as liquid crystal display devices, organic electroluminescence (EL) display devices, and inorganic electroluminescence display devices, imaging devices such as image sensor devices, and electronic devices such as image entry devices and fingerprint readers.

REFERENCE SIGNS LIST 1 substrate
3 gate electrode
5 gate insulating layer
7A oxide semiconductor layer (active layer)
7B metal oxide layer
9s source electrode
9d drain electrode
11 first insulating film
12 second insulating film
13 interlayer insulating layer
15 pixel electrode
17 contact portion
21 opening of first insulating film
70i semiconductor region of metal oxide layer
70c conductor region of metal oxide layer
10 oxide semiconductor TFT
20 storage capacitance
S source line
G gate line
101, 102, 103, 102' semiconductor device (TFT substrate)

The invention claimed is:

1. A semiconductor device comprising a substrate, a plurality of pixel regions arranged on the substrate in a matrix having a row direction and a column direction, a plurality of gate lines each extending generally parallel in the row direction, and a plurality of source lines each extending generally parallel in the column direction, wherein
   each of the plurality of pixel regions includes
      a thin film transistor supported on the substrate, the thin film transistor including a gate electrode, a gate insulating layer covering the gate electrode, an oxide semiconductor layer provided on the gate insulating layer, and a source electrode and a drain electrode which are electrically connected to the oxide semiconductor layer,
      a metal oxide layer formed out of a same oxide film as the oxide semiconductor layer,
      an interlayer insulating layer covering the thin film transistor and the metal oxide layer, and
      a pixel electrode provided on the interlayer insulating layer and electrically connected to the drain electrode,
   the metal oxide layer includes a conductor region, and
   the pixel electrode overlaps with at least a part of the conductor region with the interlayer insulating layer interposed therebetween, and wherein
   the plurality of pixel regions include a first pixel region and a second pixel region adjoining the first pixel region in the column direction, and
   the conductor regions of the metal oxide layers which are present in the first pixel region and the second pixel region are electrically connected to each other.

2. The semiconductor device of claim 1, wherein the metal oxide layer in the first pixel region and the metal oxide layer in the second pixel region are integrally formed.

3. The semiconductor device of claim 1, further comprising a connecting wire formed out of a same electrically-conductive film as the plurality of source lines and extending in the column direction across the first and second pixel regions,
   wherein the conductor regions of the metal oxide layers which are present in the first pixel region and the second pixel region are electrically connected to each other via the connecting wire.

4. The semiconductor device of claim 3, wherein
   the plurality of gate lines includes a first gate line electrically connected to the gate electrode which is present in the first pixel region,
   when viewed in a direction normal to the substrate, the first gate line includes a first portion and a second portion whose width is smaller than that of the first portion, and
   when viewed in a direction normal to the substrate, at least a part of the oxide semiconductor layer that is present in the first pixel region is arranged so as to overlap with the first portion, and the connecting wire extends so as to overpass the second portion.

5. The semiconductor device of claim 1, further comprising first and second connecting portions formed out of a same electrically-conductive film as the plurality of source lines and separated from each other,
   wherein the conductor region of the metal oxide layer which is present in the second pixel region is electrically connected to the conductor region of the metal oxide layer which is present in the first pixel region via the first connecting portion and is electrically connected to the conductor region of the metal oxide layer which is present in another pixel region adjoining the second pixel region in the column direction via the second connecting portion.

6. The semiconductor device of claim 5, wherein
   the plurality of gate lines includes a first gate line electrically connected to the gate electrode which is present in the first pixel region,
   when viewed in a direction normal to the substrate, the first gate line includes a first portion and a second portion whose width is smaller than that of the first portion, and
   when viewed in a direction normal to the substrate, at least a part of the oxide semiconductor layer that is present in the first pixel region is arranged so as to overlap with the first portion, and the first connecting portion extends so as to overpass the second portion.

7. The semiconductor device of claim 1, wherein
   the each of the plurality of pixel regions further includes a contact portion at which the drain electrode and the pixel electrode are in direct contact with each other in a contact hole formed in the interlayer insulating layer, and
   when viewed in a direction normal to the substrate, the contact portion is arranged so as to adjoin the thin film transistor in the column direction.

8. The semiconductor device of claim 1, wherein
   the metal oxide layer further includes a semiconductor region, and
   the semiconductor region is located in a perimetric portion of the metal oxide layer.

9. The semiconductor device of claim 8, wherein
   the interlayer insulating layer includes a first insulating film and a second insulating film provided on the first insulating film,
   the first insulating film has an opening on the metal oxide layer, and
   the conductor region includes a part of the metal oxide layer which is exposed through the opening, and the semiconductor region includes a part of the metal oxide layer which is covered with the first insulating film.

10. The semiconductor device of claim 9, wherein a part of the interlayer insulating layer located between the conductor region of the metal oxide layer and the pixel electrode includes the second insulating film and does not include the first insulating film.

11. The semiconductor device of claim 1, wherein the oxide semiconductor layer and the metal oxide layer include at least one metal element among In, Ga and Zn.

12. The semiconductor device of claim 11, wherein the oxide semiconductor layer and the metal oxide layer include a crystalline portion.

13. A method for manufacturing a semiconductor device, the semiconductor device including a substrate, a plurality of pixel regions arranged in a matrix having a row direction and a column direction, a thin film transistor provided in each of the plurality of pixel regions, a plurality of gate lines each extending generally parallel in the row direction, and a plurality of source lines each extending generally parallel in the column direction,
   the plurality of pixel regions including first and second pixel regions adjoining each other in the column direction, the method comprising in each of the first and second pixel regions:
      (a) forming on the substrate a gate electrode and a gate insulating layer covering the gate electrode;

(b) forming an oxide semiconductor film on the gate insulating layer and patterning the formed oxide semiconductor film, thereby forming an oxide semiconductor layer and a metal oxide layer, the oxide semiconductor layer being arranged such that at least a part of the oxide semiconductor layer overlaps with the gate electrode with the gate insulating layer interposed therebetween;

(c) forming a source electrode and a drain electrode so as to be in contact with the oxide semiconductor layer;

(d) forming a first insulating film so as to cover the source electrode and the drain electrode and the metal oxide layer and forming in the first insulating film a first opening through which a part of the drain electrode is exposed and a second opening through which a part of the metal oxide layer is exposed;

(e) converting the part of the metal oxide layer which is exposed through the second opening into a conductor, thereby forming a conductor region, while a part of the metal oxide layer which is not converted into a conductor remains as a semiconductor region;

(f) forming a second insulating film on the first insulating film and in the first and second openings and removing a part of the second insulating film located in the first opening, thereby forming a contact hole which penetrates through the first and second insulating films and through which the drain electrode is exposed; and (g) forming a pixel electrode on the second insulating film and in the contact hole, the pixel electrode being arranged so as to be in contact with the drain electrode in the contact hole and to overlap with at least a part of the conductor region of the metal oxide layer with the second insulating film interposed therebetween.

14. The method of claim 13, wherein step (b) includes integrally forming the metal oxide layers which are present in the first and second pixel regions.

15. The method of claim 13, further comprising the step of forming a connecting wire for electrically connecting the metal oxide layers which are present in the first and second pixel regions with each other, the connecting wire being formed out of a same electrically-conductive film as the source and drain electrodes.

16. The method of claim 13, further comprising the step of forming first and second connecting portions so as to be separated from each other, the first connecting portion being arranged so as to connect the metal oxide layers which are present in the first and second pixel regions, and the second connecting portion being arranged so as to connect the metal oxide layers which are present in the second pixel region and another pixel region adjoining the second pixel region in the column direction.

* * * * *